(12) United States Patent
Kinyua et al.

(10) Patent No.: US 7,292,170 B2
(45) Date of Patent: Nov. 6, 2007

(54) SYSTEM AND METHOD FOR IMPROVED TIME-INTERLEAVED ANALOG-TO-DIGITAL CONVERTER ARRAYS

(75) Inventors: Martin Kithinji Kinyua, Dallas, TX (US); William J. Bright, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 80 days.

(21) Appl. No.: 11/151,133

(22) Filed: Jun. 13, 2005

(65) Prior Publication Data
US 2006/0279445 A1 Dec. 14, 2006

(51) Int. Cl.
*H03M 3/00* (2006.01)
(52) U.S. Cl. ...................... 341/141; 341/155
(58) Field of Classification Search ................ 341/141, 341/118, 155, 156; 324/76.24
See application file for complete search history.

(56) References Cited

U.S. PATENT DOCUMENTS

| | | | |
|---|---|---|---|
| 4,968,988 A * | 11/1990 | Miki et al. ................ | 341/141 |
| 6,392,575 B1 * | 5/2002 | Eklund ..................... | 341/141 |
| 6,476,749 B1 * | 11/2002 | Yeap et al. ............... | 341/155 |
| 6,496,125 B2 * | 12/2002 | Jonsson et al. ........... | 341/118 |
| 6,541,952 B2 * | 4/2003 | Nagaraj ................... | 324/76.42 |
| 6,653,966 B1 * | 11/2003 | van der Goes et al. ... | 341/156 |
| 2004/0155807 A1 * | 8/2004 | van der Goes et al. ... | 341/156 |

OTHER PUBLICATIONS

Dyer, K.C., et al., "An Analog Background Calibration Technique for Time-Interleaved Analog-to-Digital Converters," IEEE Journal of Solid-State Circuits, Dec. 1998, pp. 1912-1919, vol. 33, No. 12, IEEE, Los Alamitos, CA.

Fu, D., et al., "A Digital Background Calibration Technique for Time-Interleaved Analog-to-Digital Converters," IEEE Journal of Solid-State Circuits, Dec. 1998, pp. 1904-1911, vol. 33, No. 12, IEEE, Los Alamitos, CA.

Yotsuyanagi, M., et al., "A 10-b 50-MHz Pipelined CMOS A/D Converter with S/H," IEEE Journal of Solid-State Circuits, Mar. 1993, pp. 292-300, vol. 28, No. 3, IEEE, Los Alamitos, CA.

* cited by examiner

*Primary Examiner*—Jean Bruner Jeanglaude
(74) *Attorney, Agent, or Firm*—Wade J. Brady, III; Frederick J. Telecky, Jr.

(57) ABSTRACT

System and method for improved time-interleaved analog-to-digital converter arrays which reduces sampling mismatch distortion found in prior art arrays. There may be two causes of non-uniform sampling mismatch in a TI-ADC array, a mismatch due to skew and a mismatch due to clock jitter. To minimize non-uniform sampling mismatch, the mismatch due to skew can be addressed. A preferred embodiment comprises adjusting a delay imparted on the sampling clock by an adjustable delay in each channel of a plurality of channels in the TI-ADC array to minimize skew and randomly switching between two delays that span a zero-skew delay to reduce residual skew in each channel and thus eliminate (or reduce) frequency domain tones caused by non-uniform sampling mismatch.

20 Claims, 4 Drawing Sheets

SYSTEM AND METHOD FOR IMPROVED TIME-INTERLEAVED ANALOG-TO-DIGITAL CONVERTER ARRAYS

TECHNICAL FIELD

The present invention relates generally to a system and method for digital signal processing, and more particularly to a system and method for an improved time-interleaved analog-to-digital converter array that reduces the sampling mismatch distortion of prior art time-interleaved analog-to-digital converter arrays.

BACKGROUND

Corresponding to the increased operating frequency and complexity of electronic devices, for example, with high-definition television (HDTV), there is a need for analog-to-digital converters (ADCs) to operate at higher sampling rates as well as provide greater conversion resolution. Typically, an ADC that is capable of operating at sufficiently high sampling rates must trade-off conversion resolution, while a high conversion resolution ADC usually is not capable of operating at high sampling rates.

A time-interleaved ADC (TI-ADC) array is commonly used when a single ADC is not capable of meeting the needed sampling rate while providing desired conversion resolution. A TI-ADC array comprises a plurality of ADCs arranged in parallel fashion with a signal to be converted being provided to each ADC in the plurality of ADCs. Each ADC is responsible for converting only a portion of the signal and therefore can perform the conversion at a slower rate. For example, if a TI-ADC array has M ADCs arranged in parallel fashion, where M is an integer number, then each of the M ADCs is only required to be able to convert the signal at 1/M-th of the desired sampling rate.

A problem that occurs in TI-ADC arrays, especially in arrays with a large number of ADCs, is that TI-ADC arrays are sensitive to non-uniform sampling mismatch distortion. The non-sampling mismatch distortion occurs when there are differences in the sampling times at the various ADCs in the TI-ADC array and presents itself in the form of frequency dependent aliases of the spectrum of the signal at integer multiples of the ADC sampling rate. These frequency dependent aliases degrade the signal to noise plus distortion ratio (SNDR) and the spurious free dynamic range (SFDR) of the ADC.

With reference now to FIG. 1, there is shown a diagram of a prior art implementation of a time-interleaved analog-to-digital converter (TI-ADC) array 100. The TI-ADC array 100 can be used where there is a need for high conversion frequencies as well as high conversion resolution, such as in digital television applications, i.e., high-definition television (HDTV). Rather than having a single high conversion rate, high resolution ADC that is capable of converting an analog signal at a sampling rate, $f_s$, the TI-ADC array 100 makes use of a plurality of ADCs 105 arranged in a parallel configuration. The TI-ADC array 100, shown in FIG. 1, has a total of M ADCs 105. Each of the ADCs 105 may have a sampling rate of $f_s/M$. Therefore, the sampling rate of the ADCs 105 can be significantly lower than the sampling rate of the overall TI-ADC array 100, $f_s$. With the lower sampling rate, cheaper ADCs can be used, ADCs with a higher conversion resolution can be used, and/or the sampling rate of the overall TI-ADC array 100, $f_s$, can be pushed higher.

An analog demultiplexer 110 can be used to provide an input signal, X(t), to inputs of the M ADCs 105. The analog demultiplexer 110 changes a coupling between the input signal, X(t), to an input of one of the M ADCs 105 at a frequency that is substantially equal to the sampling rate of the TI-ADC array 100, $f_s$. For example, if the sampling frequency is 100 MHz, then once every 10 nano-seconds, the analog demultiplexer 110 changes a coupling between the input signal and an input to one of the M ADCs 105.

In order to meet the desired sampling rate of the TI-ADC array 100, $f_s$, each of the M ADCs 105 needs to operate at a sampling rate of $f_s/M$. Once every M*T seconds, wherein T is an inverse of the sampling frequency, $f_s$, the analog demultiplexer 110 couples an input of an ADC 105 to the input signal, X(t). For example, with a sampling rate of 100 MHz and M equal to five, then once every 50 nano-seconds, the input signal, X(t), is provided to an input of an ADC 105. Each signal path containing an ADC 105 can be referred to as a channel.

A digital multiplexer 115 can be used to recombine outputs from the M ADCs 105 back into a single output signal stream, a digital signal stream made up of digitized samples of the input signal, X(t), represented as X(nT). The output signal, X(nT), comprises a sequence of digitized samples, one every T seconds, with a number of bits in each digitized sample being determined by the conversion resolution of the M ADCs 105. The digital multiplexer 115 changes a coupling between an output of one of the M ADCs 105 to the output signal at a frequency that is substantially equal to the sampling rate, $f_s$. Therefore, an output of an ADC 105 is periodically coupled to the output signal once every M*T seconds.

The overall performance of a prior art TI-ADC array, such as the TI-ADC array 100 (FIG. 1), can be limited by sensitivity to offset, gain, and non-uniform sampling mismatches between the different ADCs 105. Offset mismatches, as in DC offset, between the ADCs 105 can contribute to a periodic additive pattern at the output of the TI-ADC array. In the frequency domain, this additive pattern appears as tones at integer multiples of the sampling rate of the uADCs 105, $f_s/M$. Gain mismatches between the ADCs 105 result in spectral copies of the input signal to appear centered about integer multiples of the channel sampling rate ($f_s/2$). Finally, non-uniform sampling mismatches produces frequency dependent aliases of the input spectrum at integer multiples of the channel sampling rate.

The non-uniform sampling mismatch of the array of FIG. 1 can be further decomposed into two components, a skew component and a clock jitter component. The skew component may be a result of propagation delays seen in a clock signal used to time the operation of the M ADCs 105 in the TI-ADC array 100. Due to differences in conductor trace length in the clock signal lines, mismatches between various active and passive devices, and so forth, a clock edge can arrive at each of the different M ADCs 105 at different times. This can lead to sampling time mismatches since the same clock edge at the different M ADCs 105 is assumed to be indicative of the same instance in time. The clock jitter component may be a result of inaccuracies in the clock generation circuitry.

Two-rank sampling is a known technique that can be used to help reduce the non-uniform sampling mismatch distortion. Two-rank sampling makes use of a front-end sampler operating at full sampling rate of the TI-ADC array to reduce any sampling time mismatches. Since a single full rate front-end sampler is used, sampling time mismatches at the various ADCs in the TI-ADC array can be minimized.

One disadvantage of the prior art approach is that there is a need for the front-end sampler to operate at the full sampling rate of the TI-ADC array. This circuit may be difficult to achieve in a size efficient and cost efficient manner. Furthermore, with the front-end sampler operating at full sampling rate, the TI-ADC array may have high power consumption. This can lead to heat dissipation problems as well as more stringent power supply specifications.

SUMMARY OF THE INVENTION

These and other problems are generally solved or circumvented, and technical advantages are generally achieved, by preferred embodiments of the present invention that provides a system and method for reducing sampling mismatch distortion in time-interleaved analog-to-digital converters.

In accordance with a preferred embodiment of the present invention, a method for reducing non-uniform sample mismatch in a time-interleaved analog-to-digital converter (TI-ADC) array is provided. The method includes adjusting a delay imparted by an adjustable sampling clock delay present in each channel of multiple channels in the TI-ADC array to reduce a measured sample mismatch and randomly switching between two sampling clock delays imparted by the adjustable delay in each channel to reduce a residual skew, wherein the two delays span an actual delay that would bring the measured sample mismatch substantially equal to zero.

In accordance with another preferred embodiment of the present invention, a time-interleaved analog-to-digital (TI-ADC) array is provided. The TI-ADC array includes a plurality of channels, with each channel coupled to a signal input. Each channel includes a sample and hold circuit (SHC) that is coupled to the signal input, the SHC to capture a signal at the signal input and provide the captured signal at an output. Each channel also includes an analog-to-digital converter (ADC) that is coupled to the SHC, the ADC to convert an analog signal at an input into a digital representation of the analog signal. The TI-ADC array further includes multiple adjustable delays that are coupled to a clock signal source and a multiplexer with an input that is coupled to an ADC from each channel. The adjustable delays impart a delay onto a signal at a first input, where the delay is based upon a signal at a second input. The multiplexer selectively couples an output from an ADC to a digital signal output of the TI-ADC array.

In accordance with another preferred embodiment of the present invention, a system for reducing non-uniform sample mismatch in a time-interleaved analog-to-digital (TI-ADC) array is provided. The system includes a means for reducing a clock skew between clock signals in each channel of a plurality of channels in the TI-ADC array and a means for randomly switching between delays imparted to the clock signal in each channel.

An advantage of a preferred embodiment of the present invention is that the ADCs in the TI-ADC array can operate at a sampling rate that is lower than the desired sampling rate. The ADCs with lower sampling rates typically are cheaper and require less energy than their faster counterparts. Therefore, it can be possible to provide desired conversion resolution with desired sampling rate in a TI-ADC array that is both cost effective and energy efficient.

A further advantage of a preferred embodiment of the present invention is that sampling timing mismatches can be reduced (or substantially eliminated) therefore the TI-ADC array can have good SNDR and SFDR values, thereby having good performance characteristics.

Yet another advantage of a preferred embodiment of the present invention is that with sampling timing mismatches reduced, the number of ADCs in the TI-ADC array can be increased without significantly increasing performance degradation due to sampling timing mismatches with the additional ADCs. Therefore, more ADCs can be added to the TI-ADC array and continue to push the overall sampling rate up while increasing possible conversion resolution.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a TI-ADC array for use in digital television applications. The invention may also be applied, however, to other TI-ADC applications wherein high sampling rates are needed along with high conversion resolution, such as digital video devices, high data-rate communications, and so forth.

The present invention reduces sampling mismatch distortion in a TI-ADC array by addressing the clock skew component of non-uniform sampling mismatch. By reducing the contributions of the skew component, the sampling mismatch distortion in a TI-ADC array can be reduced, thereby increasing the SNDR and the SFDR of the system.

Figure 1:
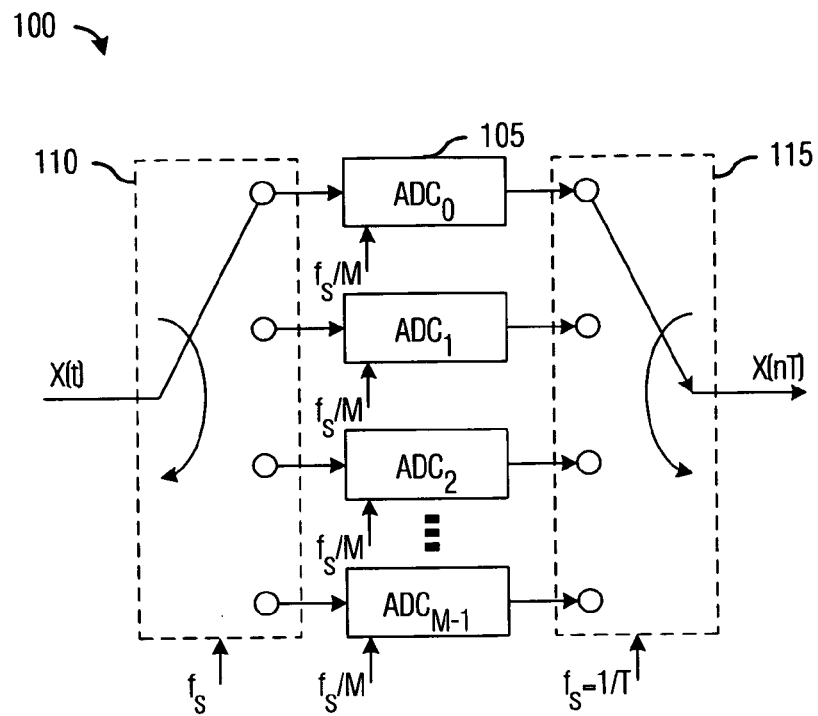
FIG. 1 is a diagram of a prior art implementation of a TI-ADC array.
Figure 2:
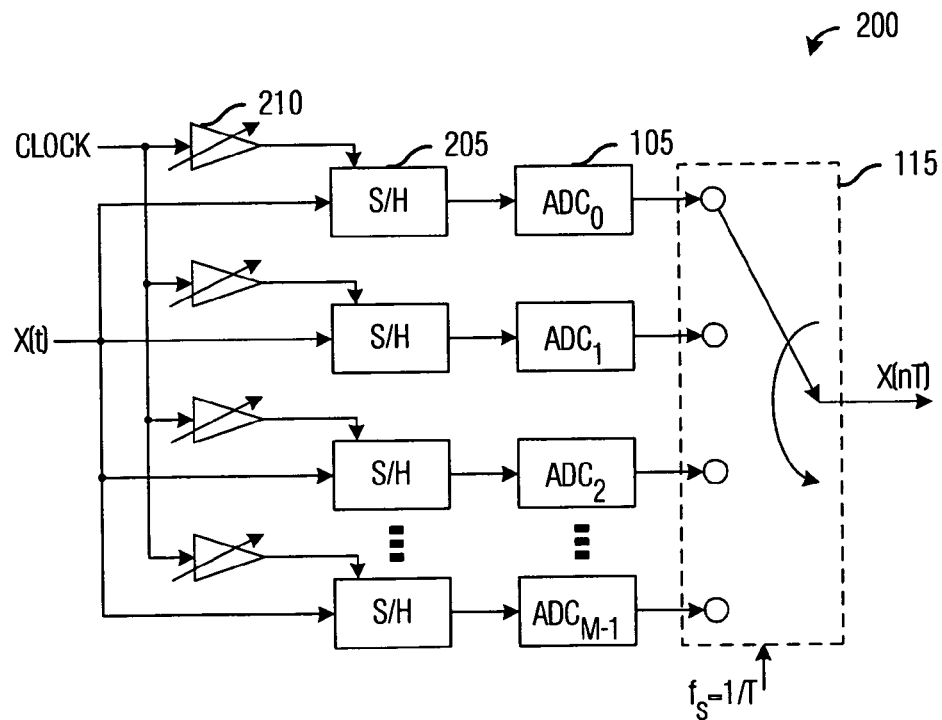
FIG. 2 is a diagram of a TI-ADC array, wherein the TI-ADC array has built-in compensation for use in reducing a skew component of non-uniform sampling mismatch, according to a preferred embodiment of the present invention.

With reference now to FIG. 2, there is shown a diagram illustrating a TI-ADC array 200, wherein the TI-ADC array 200 has built-in compensation for reducing the skew component of non-uniform sampling mismatch, according to a preferred embodiment of the present invention. As shown in FIG. 2, the TI-ADC array 200 includes the M ADCs 105 and the digital multiplexer 115. The M ADCs 105 and the digital multiplexer 115 may operate as described in the TI-ADC array 100 (FIG. 1). The built-in compensation for reducing the skew component of non-uniform sampling mismatch comprises a sample and hold unit 205 coupled in between the input signal, X(t), and an ADC 105. The sample and hold unit 205 can, upon receiving an appropriate control signal, capture a value at an input and maintain that value for a desired amount of time. There should be one sample and hold unit 205 for each ADC 105, therefore, with M ADCs 105, there should be M sample and hold units 205. Each of the M channels in the TI-ADC array 200 comprises a sample and hold unit 205 and an ADC 105.

Control of the operation of the sample and hold units 205 can be regulated by an adjustable propagation delay, such as an adjustable delay 210. The adjustable delay 210 can be used to insert a delay into a signal at its input, wherein the delay inserted by the adjustable delay 210 can be controllable by a current or a voltage. Again, there should be one adjustable delay 210 for each sample and hold unit 205. Connected to an input of the adjustable delay 210 can be a clock, which can be used to generate control signals that can specify when the sample and hold units 205 capture a value at their input. Since the control signals provided by the clocks may traverse conductive traces of differing lengths, it can be possible that a control signal specifying the operation of the sample and hold units 205 arrives at the various sample and hold units 205 at different times. It is the differences in time that lead to the skew component of the non-uniform sampling mismatch. Mismatches in the electronic circuitry components, for example, in transistors, may also cause skew. The adjustable delays 210 can be configured to insert delays of different values into the signal paths of the control signals generated by the clock so that the control signals arrive at the sample and hold units 205 at substantially the same time. A channel of the TI-ADC array 200 may also be expanded to include an adjustable delay 210 that is coupled to its sample and hold unit 205.

Figure 3A:
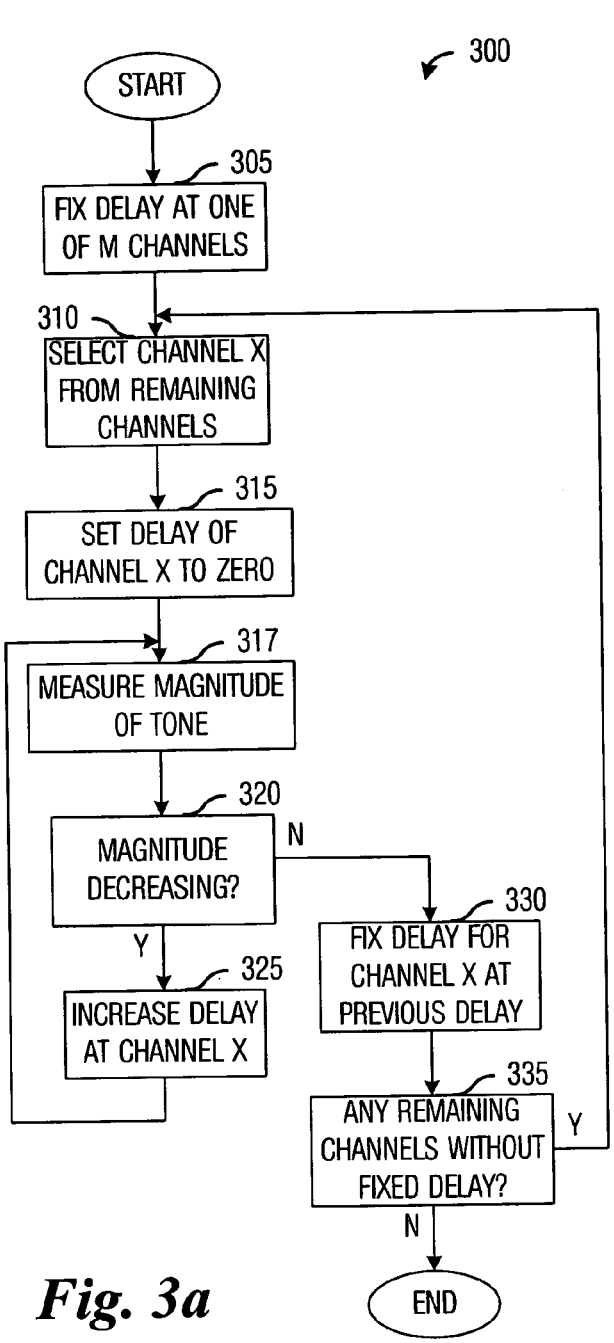
FIGS. 3a through 3c are diagrams of an algorithm for use in adjusting adjustable delays so that control signals provided by a clock can arrive at sample and hold units at substantially the same time and data plots of an exemplary determination of a delay setting for an adjustable delay, according to a preferred embodiment of the present invention.
Figure 3B:
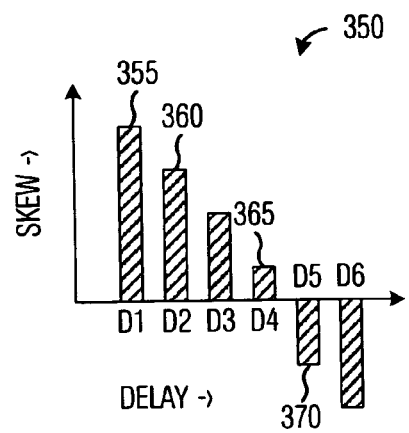
Figure 3C:
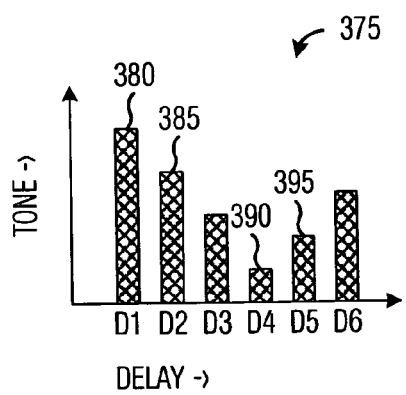

With reference now to FIGS. 3a through 3c, there are shown diagrams illustrating an algorithm 300 for use in adjusting the adjustable delays 210 so that control signals provided by a clock can arrive at the sample and hold units 205 at substantially the same time and data plots 350 and 375 of an exemplary determination of a delay setting for an adjustable delay 210, according to a preferred embodiment of the present invention. According to a preferred embodiment of the present invention, the algorithm 300 may execute on a controller, a processing element, a custom designed integrated circuit, a general purpose processor, or so on, that can be responsible for controlling the operation of a TI-ADC array (along with other circuitry) during the course of normal operations. The algorithm 300 may be executed during a test/calibration and configuration period to properly adjust the adjustable delays 210 to reduce non-uniform sampling mismatch. During the test/calibration and configuration period, hardware can be powered-on and tested, calibrated, and/or configured by software and firmware routines built into the hardware. Alternatively, the algorithm 300 can be executed during the manufacture of the TI-ADC array and the adjustable delays 210 can be adjusted to minimize non-uniform sampling mismatch. In this situation, the algorithm 300 can be executed prior to electronic equipment containing the TI-ADC array receiving final packaging.

Regardless of when the algorithm 300 is executed, the controller that is executing the algorithm 300 performs a similar set of operations. The controller can begin by selecting one of the M channels in the TI-ADC array and fixing a delay at the channel's adjustable delay 210 (block 305). According to a preferred embodiment of the present invention, the delay of the adjustable delay 210 that is selected to be fixed should be set to a delay that will exceed an expected maximum clock skew seen at any of the remaining M-1 channels. For example, a clock skew shall never exceed one-half the clock period. In practice, a typical clock skew will not exceed one to two percent of the clock period. With the delay set to exceed the expected maximum clock skew, the overall propagation delay on the selected channel should be the greatest of all M channels. The delay that can be generated by an adjustable delay may not be infinitely adjustable, rather, it is likely that an adjustable delay is capable of producing a series of discrete delays. Therefore, the delay produced by the adjustable delay for the selected channel is likely to be greater than or less than the selected delay. Once the delay of an initial adjustable delay unit 210 has been set, the controller can select one of the remaining M-1 channels (block 310).

With one of the remaining M-1 channels selected, channel X, (block 310), the controller can initially set the delay of the adjustable delay 210 for channel X to zero delay (block 315) and measure a sample mismatch (block 317). The sample mismatch should be measured between the channel X and the channel selected from block 305. The sample mismatch can be measured in the frequency domain by measuring a magnitude of the tones located at integer multiples of the channel sampling rate, for example. After measuring the sample mismatch, the controller can compare the measured sample mismatch (the magnitude of the tones) from the current delay setting of the adjustable delay 210 with a measured sample mismatch from a previous delay setting of the adjustable delay 210 (block 320). If the measured sample mismatch is from an initial setting of the adjustable delay 210, then the comparison may not need to be made. If the magnitude of the tone for the current delay setting is smaller than the magnitude of the tone for the previous delay setting, then the delay adjustment is proceeding in a correct manner and the delay setting of the adjustable delay 210 should be increased (block 325) and the controller can return to block 317 to repeat the sample mismatch measurement and the tone magnitude comparison.

If the magnitude of the tone of the current delay setting is not smaller than the magnitude of the tone for the previous delay setting, then the sampling mismatch has increased between the previous delay setting and the current delay setting. This can imply that somewhere in between the previous delay setting and the current delay setting is a delay setting that will result in a measured sample mismatch that is substantially equal to zero. When this occurs, the controller can fix the delay setting for the adjustable delay 210 of the channel X to the previous delay setting (block 330). The fixing of the delay setting may involve the saving of a value that is provided to the adjustable delay to provide the desired delay. For example, the value may be a magnitude of current or voltage provided to the adjustable delay. In addition to saving the previous delay setting, the controller can also save the current delay setting. According to a preferred embodiment of the present invention, until the delay setting of the adjustable delay 210 imparts a propagation delay that exceeds the propagation delay of a clock signal through the channel with the adjustable delay 210 fixed at the maximum value (block 305), the measured sample mismatch shall continue to decrease as the delay setting of the adjustable delay 210 is increased.

Once the delay setting of the adjustable delay 210 exceeds the propagation delay of the clock signal, then the measured sample mismatch shall once again increase with increased delay settings of the adjustable delay 210. As an implementation issue, it may not be possible to provide an infinite degree of adjustment for the delay settings of the adjustable delay 210. Therefore, the delay settings may be adjusted in a series of discrete steps rather than as a continuously variable delay. Hence, it may not be possible to bring the measured sample mismatch down to be substantially equal to zero. If it is not possible to bring the measured sample mismatch down to zero, then there is a remaining sample mismatch that will continue to negatively affect the performance of the TI-ADC array, this remaining sample mismatch can be referred to as a residual skew. After fixing the delay setting for the selected channel (block 330), the controller can check to see if there are any additional channels that need to have their adjustable delay 210 adjusted (block 335). If there are, the controller can return to block 310, else the controller can terminate the execution of the algorithm 300.

The data plot shown in FIG. 3b illustrates a measured sample mismatch (a time domain measurement of the actual clock skew) between a current delay setting for the adjustable delay 210 and the channel with the adjustable delay 210 fixed at a maximum value. At a delay setting "D1," the measured mismatch is displayed as a bar 355 and a delay setting "D2," the measured mismatch is displayed as a bar 360. The bar 355 is taller than the bar 360, hence the increase in the delay from delay setting "D1" to delay setting "D2" resulted in a reduction in the sample mismatch. As shown in FIG. 3b, the measured sample mismatch continues to decrease until at delay setting "D4" with the measured sample mismatch displayed as a bar 365 and delay setting "D5" with measured mismatch displayed as a bar 370. The bar 370 has a sign that is different from that of the bar 365, indicating that the measured mismatch at delay setting "D5" has started to increase once again, but with different sign, and that somewhere between delay setting "D4" and delay setting "D5" is a delay setting that will minimize the measured sample mismatch. The controller may save delay setting "D4" and "D5," with delay setting "D4" as the previous setting and delay setting "D5" as the current setting.

The data plot shown in FIG. 3c illustrates a measured sample mismatch (a frequency domain measurement of tone magnitudes at integer multiples of channel sampling frequency) between a current delay setting for the adjustable delay 210 and the channel with the adjustable delay 210 fixed at a maximum value. At a delay setting "D1," the measured mismatch is displayed as a bar 380 and a delay setting "D2," the measured mismatch is displayed as a bar 385. The bar 380 is taller than the bar 385, hence the increase in the delay from delay setting "D1" to delay setting "D2" resulted in a reduction in the sample mismatch. As shown in FIG. 3c, the measured sample mismatch continues to decrease until at delay setting "D4" with the measured sample mismatch displayed as a bar 390 and delay setting "D5" with measured mismatch displayed as a bar 395. The bar 395 has a larger magnitude than that of the bar 390, indicating that the measured mismatch at delay setting "D5" has started to increase once again and that somewhere between delay setting "D4" and delay setting "D5" is a delay setting that will minimize the measured sample mismatch.

However, since the delay settings for the adjustable delay 210 are not continuous in nature, it is not possible (in the example discussed herein at least) to set the adjustable delay 210 to minimize the measured sample mismatch. Therefore, the adjustable delay 210 is set to impart a delay consistent with delay setting "D4" since the delay setting "D4" results in the smallest measured sample mismatch prior to the delay settings resulting in clock skew increasing once again. The remaining measured sample mismatch can be referred to as a residual sample mismatch and can be addressed using a different technique discussed below.

Figure 4A:
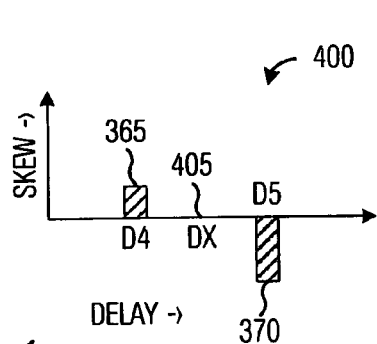
FIGS. 4a and 4b are data plots of measured sample mismatch as a function of delay setting, according to a preferred embodiment of the present invention.
Figure 4B:
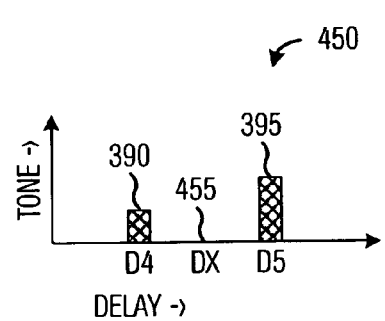

With reference now to FIGS. 4a and 4b, there are shown diagrams illustrating data plots 400 and 450 of measured sample mismatch in both the time domain and the frequency domain as a function of delay setting, according to a preferred embodiment of the present invention. Since the delay that an adjustable delay 210 can impart is not a continuous value, it may be unlikely that one of the delay settings will result in a measured sample mismatch substantially equal to zero. The diagram shown in FIG. 4a provides a detailed view of the measured sample mismatch in the time domain as a function of delay setting around delay settings "D4" and "D5." The measured sample mismatch for delay setting "D4" is shown as the bar 365 and the measured sample mismatch for delay setting "D5" is shown as the bar 370. In between (not necessarily at a midpoint) delay settings "D4" and "D5," there is a delay setting "DX," that if it were possible to adjust an adjustable delay 210 to that delay setting, the resulting measured sample mismatch would substantially be equal to zero (this is shown in FIG. 4a as highlight 405).

The diagram shown in FIG. 4b provides a detailed view of the measured sample mismatch in the frequency domain as a function of delay setting around delay settings "D4" and "D5." The measured sample mismatch for delay setting "D4" is shown as the bar 390 and the measured sample mismatch for delay setting "D5" is shown as the bar 395. In between delay settings "D4" and "D5," there is a delay setting "DX," that if it were possible to adjust an adjustable delay 210 to that delay setting, the resulting measured sample mismatch would substantially be equal to zero (this is shown in FIG. 4b as highlight 455).

It may be possible to further reduce the measured sample mismatch if it is possible to switch (change) between delay settings "D4" and "D5" in a random manner from clock cycle to clock cycle. By randomly switching between the two delay settings that minimally span an actual delay that brings the measured sample mismatch substantially to zero, it may be possible to achieve an effective delay setting that is closer to the actual delay needed. The random switching between the two delay settings can effectively push remaining tones from the residual mismatch into the noise quantization floor. This is because the random nature of the switching converts the tone energy located at a single frequency into white noise that is then spread over the baseband.

Figure 5:
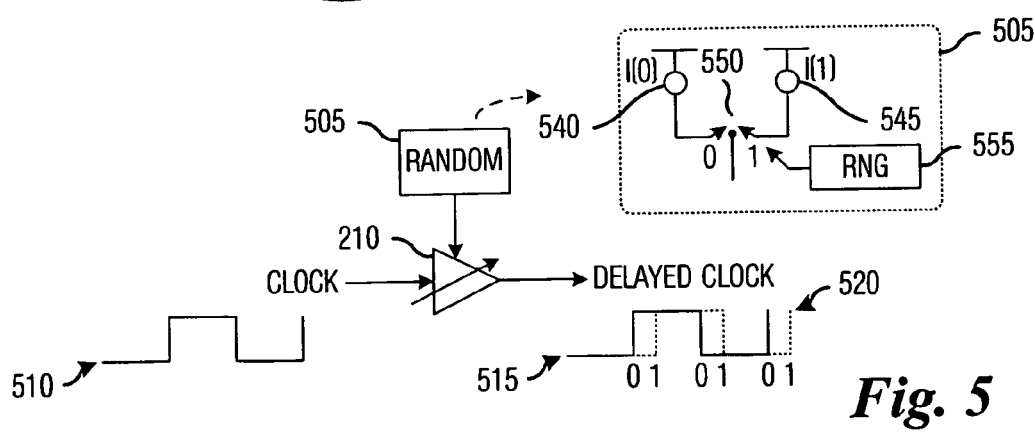
FIG. 5 is a diagram of a detailed view of an adjustable delay with a built-in randomizer to permit a randomized switching of delay settings to further reduce non-uniform sampling mismatch by reducing residual clock skew, according to a preferred embodiment of the present invention.

With reference now to FIG. 5, there is shown a diagram illustrating a detailed view of an adjustable delay with a built-in randomizer 505 to permit a randomized switching of delay settings to further reduce non-uniform sampling mismatch by reducing the impact of any residual clock skew, according to a preferred embodiment of the present invention. The diagram shown in FIG. 5 provides a detailed view of an adjustable delay, such as the adjustable delay 210 (FIG. 2), with the built-in randomizer 505, wherein a delay imparted by the adjustable delay 210 is controlled by a current provided to the adjustable delay 210. An alternate embodiment of the adjustable delay can have a delay that is controlled by a voltage provided to the adjustable delay 210. The adjustable delay 210 with the built-in randomizer 505 can be used in place of any (and all) adjustable delays 210 shown in FIG. 2.

According to a preferred embodiment of the present invention, the adjustable delay 210 with the built-in randomizer 505 can take a clock signal provided at an input (such as clock signal 510), and depending upon a value produced by the built-in randomizer 505, it can produce a clock signal 515 (for example, when the value produced by the built-in randomizer 505 is equal to zero (0)) or a clock signal 520 (for example, when the value produced by the built-in randomizer 505 is equal to one (1)). The adjustable delay 210 with built-in randomizer 505 can effectively impart one of two delays onto a signal at its input depending upon a value generated by the built-in randomizer 505.

According to a preferred embodiment of the present invention, the built-in randomizer 505 can be implemented as a pair of current sources 540 and 545, respectively, that can be coupled to the adjustable delay 210 by a switch 550. The switch 550 can take on one of two states depending upon a two-valued control signal. The control signal can be provided by a random number generator (RNG) 555, such as a pseudo-random number generator. As shown in FIG. 5, if the control signal was a first value (for example, a zero (0)), then the switch 550 would couple the current source 540 to the adjustable delay 210, while if the control signal was a second value (for example, a one (1)), then the switch 550 would coupled the current source 545 to the adjustable delay 210. The magnitudes of the currents provided by the current source 540 and the current source 545 can be different and can result in changing a delay imparted onto the signal at the input of the adjustable delay 210.

For discussion purposes and referencing the previously discussed example, when the current source 540 is coupled to the adjustable delay 210, the current provided by the current source 540 can result in the adjustable delay 210 imparting a delay that is substantially equal to the delay setting "D4" to the signal at its input, while when the current source 545 is coupled to the adjustable delay 210, the current provided by the current source 545 can result in the adjustable delay 210 imparting a delay that is substantially equal to the delay setting "D5" to the signal at its input. For example, if five milli-amperes is needed to impart a delay substantially equal to delay setting "D4" and seven milli-amperes is needed to impart a delay substantially equal to delay setting "D5", then the current source 540 can be configured to provide the five milli-amperes and the current source 545 can be configured to provide the seven milli-amperes. As discussed previously, the control signal provided to the switch 550 can be generated by the random number generator, such as a pseudo-random number generator. Random number generators and pseudo-random number generators are considered to be well known by those of ordinary skill in the art of the present invention and will not be discussed herein.

Figure 6:
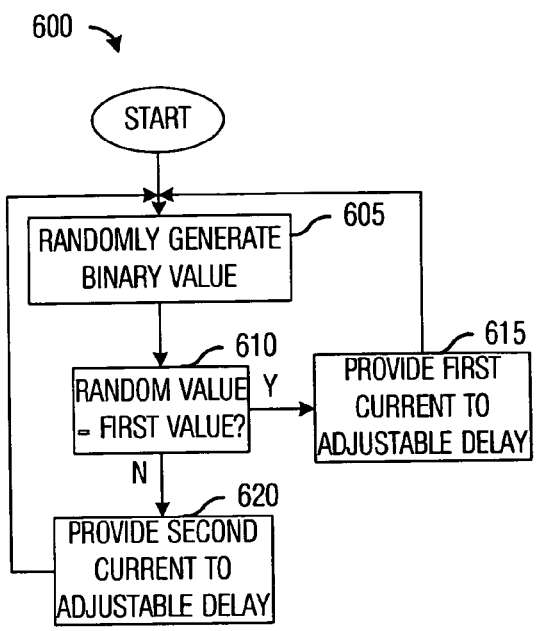
FIG. 6 is a diagram of a sequence of events describing the random switching of the delay imparted by an adjustable delay to reduce the residual clock skew, according to a preferred embodiment of the present invention.

With reference now to FIG. 6, there is shown a diagram illustrating a sequence of events 600 describing the switching of the delay imparted by an adjustable delay to reduce the residual clock skew, according to a preferred embodiment of the present invention. The sequence of events 600 can be illustrative of the operation of the switch 550 (FIG. 5) and the pseudo-random number generator 555.

The sequence of events 600 can be used when the built-in randomizer 505 (FIG. 5) features two current sources 540 and 545 (both FIG. 5). According to a preferred embodiment of the present invention, a pseudo-random number generator generates a random value that can have one of two values, for example, either a zero (0) or a one (1) (block 605). The random value can then be provided to the switch 550, and depending upon the random value (block 610), the switch 550 can either couple the current source 540 to the adjustable delay 210 (block 615) or the current source 545 to the adjustable delay 210 (block 620). When either current source 540 or 545 is coupled to the adjustable delay 210, the current provided by the current source (either current source 540 or current source 545) is provided to the adjustable delay 210. The sequence of events 600 can be repeated continuously to continually provide a randomized current to the adjustable delay 210.

Figure 7:
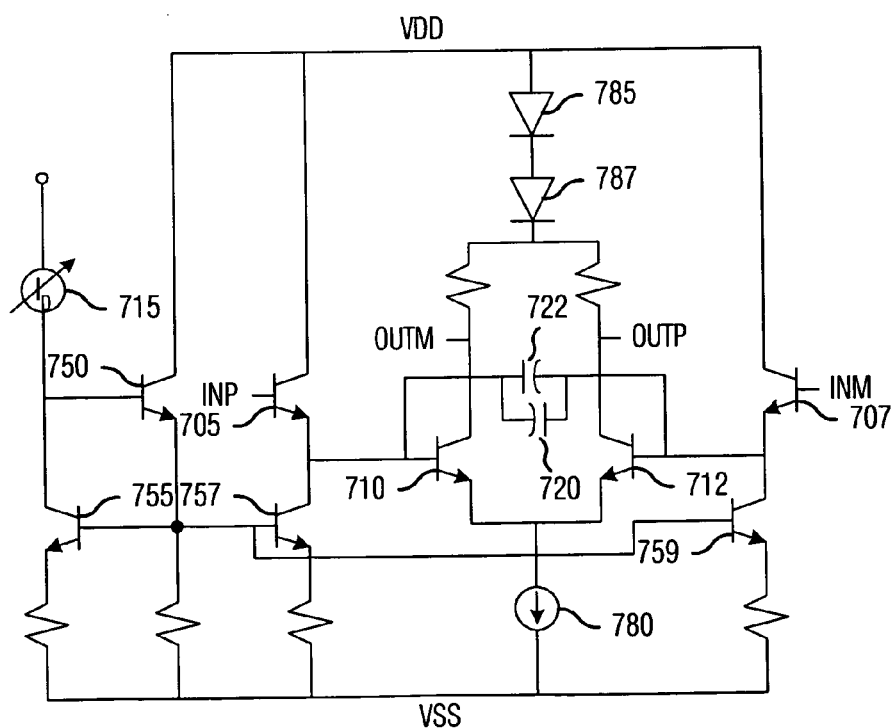
FIG. 7 is a diagram of a current controlled adjustable delay, according to a preferred embodiment of the present invention.

With reference now to FIG. 7, there is shown a diagram illustrating a current controlled adjustable delay 210, according to a preferred embodiment of the present invention. The current controlled adjustable delay 210 can impart a delay onto a signal provided at an input that is proportional to a current input. The current controlled adjustable delay 210 makes use of differential signaling. The current controlled adjustable delay 210 has an input that consists of a first pair of transistors 705 and 707 arranged in an emitter follower configuration. The differential mode signal input, denoted INP and INM can be coupled to base terminals of the first pair of transistors 705 and 707. A second pair of transistors 710 and 712 can be arranged in a differential pair configuration and provides an output for the current controlled adjustable delay 210. The delay imparted on a signal seen at the input of the current controlled adjustable delay 210 can be provided by the slew rate at emitter terminals of the pair of transistors 705 and 707, and is in turn, dependant upon a current, $I_D$ (shown as adjustable current source 715), and a pair of capacitors 720 and 722. Since the pair of capacitors 720 and 722 is fixed in manufacture, the current, $I_D$, can be used to vary the delay.

The second pair of transistors 710 and 712 can shape up the signal from the emitter terminals of the first pair of transistors 705 and 707 to a form that is similar to that of the input signal. A current mirror, formed from transistors 755, 757, and 759, can be used to accurately reflect the current $I_D$ to emitter terminals of the first pair of transistors 705 and 707. While a transistor 750 can be used to increase the accuracy of the current mirror (transistors 755, 757, and 759). A current source 780 can be used to set a bias current for the second pair of transistors 710 and 712. Finally, a pair of diodes 785 and 787 can help set the DC level of the output of the current controlled adjustable delay 210 by providing two diode voltage drops.

Figure 8:
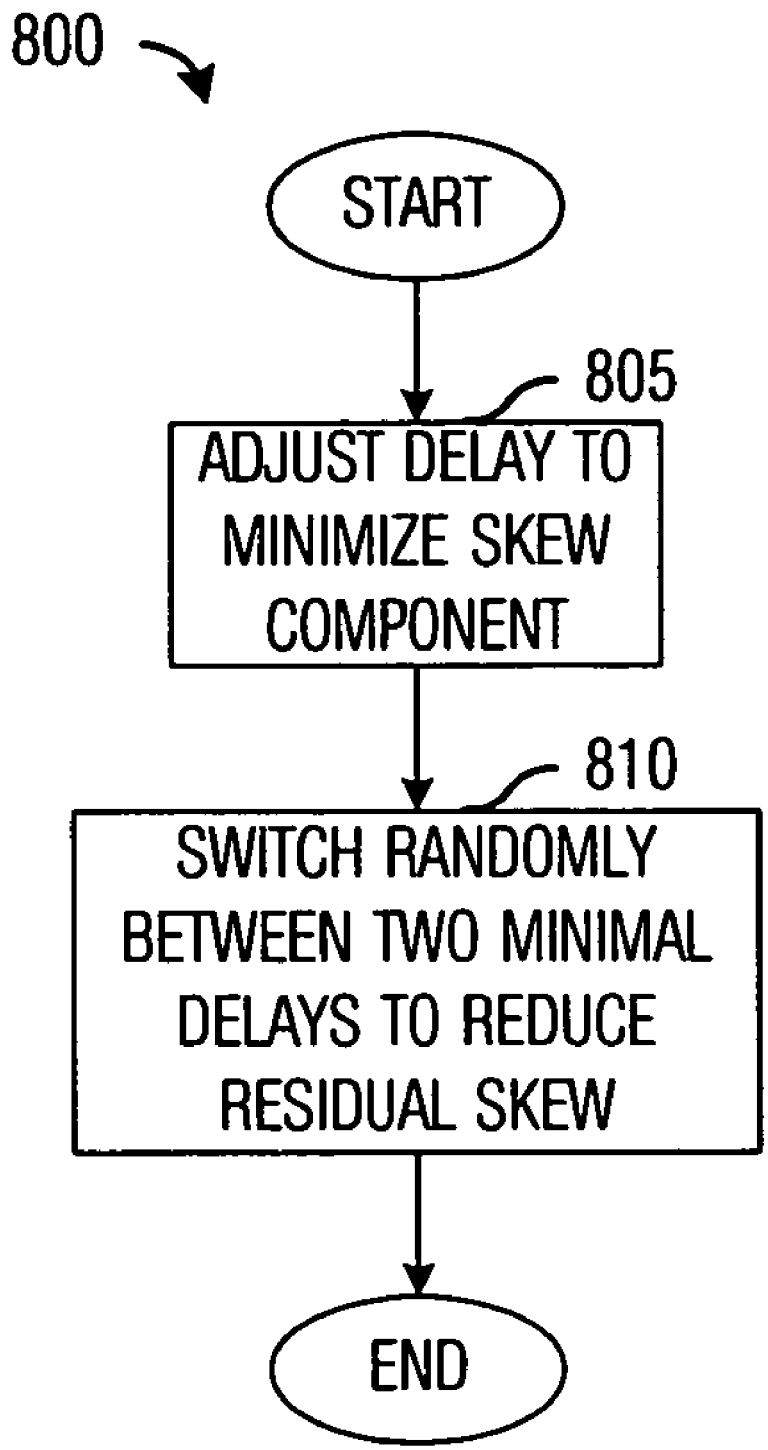
FIG. 8 is a diagram of an algorithm for use in minimizing non-uniform sampling mismatch in a TI-ADC array, according to a preferred embodiment of the present invention.

With reference now to FIG. 8, there is shown a diagram illustrating an algorithm 800 for use in minimizing non-uniform sampling mismatch in a TI-ADC array, according to a preferred embodiment of the present invention. According to a preferred embodiment of the present invention, the algorithm 300 may execute on a controller, a processing element, a custom designed integrated circuit, a general purpose processor, or so on, that can be responsible for controlling the operation of a TI-ADC array (along with other circuitry) during the course of normal operations.

The controller can begin by adjusting a delay in each channel of a TI-ADC array, such as the TI-ADC array 200 (FIG. 2), to minimize the skew component of the non-uniform sampling mismatch (block 805). According to a preferred embodiment of the present invention, the controller can adjust the delay in each channel of the TI-ADC array 200 by executing the algorithm 300 (FIG. 3a), which provides a method for adjusting a delay imparted by adjustable delays 210 (FIG. 2) to minimize sampling mismatch. As discussed previously, since the adjustable delays 210 may not be capable of providing infinitely fine delay adjustment and therefore may not be able to bring the sampling mismatch to zero, there can be a residual clock skew component. The controller may then need to randomly switch between two minimal delays to further reduce the sampling mismatch by reducing (or eliminating) the residual clock skew component (block 810). The randomized switching between two delays can effectively push any remaining tones arising from clock skew into the noise floor.

The two delays that the adjustable delay should randomly impart to the signal at its input should minimally span a delay that would actually bring the clock skew down to zero. The two delays selected should be the two delays closest to the delay that would actually bring the clock skew down to zero. For example, the adjustable delay 210 should randomly switch between delay settings "D4" and "D5" as shown in FIGS. 4a and 4b. The controller can affect a randomized delay by configuring a circuit, for example, the built-in randomizer 505 (FIG. 5), that can be used to provide one of two values to the adjustable delay 210 depending on a randomly generated value. The value may be currents for a current-based adjustable delay or voltages for a voltage-based adjustable delay. Refer to FIG. 6 for an exemplary sequence of events illustrating the operation of a circuit that can be used to randomly switch delays in the adjustable delay 210. The switching of the randomized delay occurs continually during the operation of the TI-ADC array, therefore, the circuit should be able to be configured by the controller and then operate without intervention after being started. After configuring and starting the circuit, the controller can terminate the execution of the algorithm 800.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for reducing non-uniform sample mismatch in a time-interleaved analog-to-digital converter (TI-ADC) array, the method comprising:
    adjusting a sampling clock delay imparted by an adjustable delay in each channel of a plurality of channels in the TI-ADC array in which the channels are utilized in a constant cyclic order to reduce a measured sample mismatch; and
    randomly switching between two sampling clock delays imparted by the adjustable delay in each channel to reduce a residual skew, wherein the two delays span an actual delay that would bring the measured sample mismatch substantially to zero.

2. The method of claim 1, wherein the adjusting comprises:
    fixing the delay at one channel to a maximum delay;
    for each remaining channel,
        setting the delay to a first delay value;
        measuring a first sample mismatch;
        incrementing the delay value;
        measuring a second sample mismatch;
        incrementing the delay value and repeating the second measuring and the incrementing if successive measured sample mismatch values continue to decrease; and
        saving the delay for the channel to be equal to the delay value immediately prior to a current delay value if there is an increase in the measured sample mismatch of the current delay value compared to the measured sample mismatch of the delay value immediately prior to the current delay value.

3. The method of claim 2, wherein the maximum delay is a delay selected to exceed a propagation delay seen by any of the channels in the TI-ADC.

4. The method of claim 2, wherein the two delays comprises a first delay and a second delay, wherein the first delay is the saved delay value, and wherein the second delay is a delay value immediately succeeding the saved delay value.

5. The method of claim 1, wherein the random switching comprises:
    for each channel in the TI-ADC array,
        randomly generating a value; and
        imparting one of the two delays, wherein the delay imparted is based upon the randomly generated value.

6. The method of claim 5, wherein the randomly generated value has one of two values, and wherein when the randomly generated value is of a first value, then a first delay is imparted by the channel, and when the randomly generated value is of a second value, then a second delay is imparted by the channel.

7. The method of claim 6, wherein the first delay and the second delay spans a delay range, wherein there exists a zero-mismatch delay in the delay range with which a measured sample mismatch is substantially equal to zero when the adjustable delay is set to the zero-mismatch delay value.

8. The method of claim 1, wherein the delay imparted by the adjustable delay is determined by a magnitude of a current provided to the adjustable delay.

9. The method of claim 1, wherein the adjusting occurs during an initial configuration operation.

10. The method of claim 1, wherein measuring a sample mismatch comprises measuring a magnitude of tones located at integer multiples of a channel's sampling frequency.

11. A time-interleaved analog-to-digital converter (TI-ADC) array comprising:
   a plurality of channels, each channel coupled to a signal input, wherein each channel comprises
      a sample and hold circuit (SHC) coupled to the signal input, the SHC configured to capture a signal at the signal input and provide the captured signal at an output;
      an analog-to-digital converter (ADC) coupled to the SHC, the ADC configured to convert an analog signal at an input into a digital representation of the analog signal;
   the TI-ADC array further comprising,
      a plurality of adjustable delays coupled to a clock signal source, each adjustable delay coupled to a SHC of a channel in the plurality of channels, each adjustable delay configured to impart a delay onto a signal at a first input, wherein the delay imparted by the adjustable delay is based upon a signal at a second input and wherein the clock signal source activates the channels in a constant cyclic order; and
      a multiplexer having an input coupled to an ADC from each channel in the plurality of channels, the multiplexer configured to selectively couple an output from an ADC to a digital signal output of the TI-ADC array.

12. The TI-ADC array of claim 11, wherein the signal at the second input of an adjustable delay is a current, and wherein a magnitude of the current determines the delay imparted by the adjustable delay.

13. The TI-ADC array of claim 11, wherein the clock signal source provides a clock signal that is substantially equal to a desired sampling rate of the TI-ADC array divided by M, where M is a number of channels in the plurality of channels.

14. The TI-ADC array of claim 11 further comprising a plurality of built-in randomizers, each built-in randomizer coupled to an adjustable delay, the built-in randomizer configured to produce a random two-valued signal that is used to switch the delay imparted by the adjustable delay.

15. The TI-ADC array of claim 14, wherein the delays imparted by the adjustable delays are determined by a magnitude of a current provided at the second input of each adjustable delay, and wherein the built-in randomizer provides one of two currents to the second input of the adjustable delay, wherein a magnitude of the current provided by the built-in randomizer is based upon a value of the random two-valued signal.

16. The TI-ADC array of claim 15, wherein the built-in randomizer comprises:
   a pseudo-random number generator being configured to generate the random two-valued signal;
   a first current source;
   a second current source; and
   a switch having a first input coupled to the first current source, a second input coupled to the second current source, and a third input coupled to the pseudo-random number generator, the switch configured to couple either the first input or the second input to an output based upon a value of the random two-valued signal.

17. A system for reducing non-uniform sample mismatch in a time-interleaved analog-to-digital converter (TI-ADC) array, the system comprising:
   a means for reducing a clock skew between clock signals in each channel of a plurality of channels in the TI-ADC array in which the channels are utilized in a constant cyclic order; and
   a means for randomly switching between delays imparted to the clock signal in each channel.

18. The system of claim 17, wherein the means for reducing clock skew reduces a clock skew for a channel with respect to a clock of a reference channel.

19. The system of claim 17, wherein the means for reducing clock skew comprises an adjustable delay means for inserting a configurable delay to the clock signal of a channel.

20. The system of claim 19, wherein the means for randomly switching between delays comprises:
   a random value means for generating a random two-valued sequence; and
   a delay switching means for providing a delay value based on a value generated by the random value means to the adjustable delay means.

* * * * *